United States Patent [19]

Wong

[11] Patent Number: 5,085,913
[45] Date of Patent: Feb. 4, 1992

[54] SILICONE MATERIAL

[75] Inventor: Ching-Ping Wong, Lawrenceville, N.J.

[73] Assignee: AT&T Bell Laboratories, Murray Hill, N.J.

[21] Appl. No.: 515,963

[22] Filed: Apr. 27, 1990

[51] Int. Cl.$^5$ .................. B32B 9/04; B31B 31/26
[52] U.S. Cl. ..................... 428/76; 428/68; 428/447; 357/72; 427/96; 264/272.13; 264/272.17
[58] Field of Search ............ 428/68, 76, 447; 357/72; 264/272.13, 272.17; 427/82, 96

[56] References Cited

U.S. PATENT DOCUMENTS 4,564,562  1/1986  Wong .................... 428/447
4,888,226 12/1989  Wong .................... 428/76

OTHER PUBLICATIONS

C. P. Wong, "Integrated Circuit Device Encapsulants," Chapter 3 in *Polymers for Electronic Applications*, edited by J. H. Lai, (CRC Press, Inc., Boca Katon, FL 12/1989), pp. 63–92.

Primary Examiner—Alexander S. Thomas
Attorney, Agent, or Firm—R. B. Anderson

[57] ABSTRACT

An electronic device employs as a dielectric (17) a silicone resin consisting essentially of (a) about twenty-one to twenty-five percent by weight of a silicone resin consisting essentially of dimethylsiloxane, and/or dimethylmethylphenylsiloxane, and/or dimethyl-diphenylsiloxane, (b) about seventy to eighty percent by weight of a silica filler, (c) about 0.5 to 0.7 percent by weight of a tin catalyst, and (d) about 0.057 to 0.26 percent by weight of copper (II) benzoylacetonate.

13 Claims, 2 Drawing Sheets

SILICONE MATERIAL

TECHNICAL FIELD

This invention relates to dielectric materials used in conjunction with electronic devices, and, more particularly, to improved silicone materials.

BACKGROUND OF THE INVENTION

As described, for example, in the paper "An Integrated Circuit Device Encapsulants," by C. P. Wong, included in the book *Polymers for Electronic Applications*, edited by J. H. Lai, CRC Press, Inc., Boca Raton, Fla., 1989, pp. 63-92, organic materials such as silicone resins are coming into increased use for electronics packaging, encapsulation and interconnection. Many of these materials have the appropriate thermal stability, dielectric properties, chemical stability and resistance to atmospheric deterioration needed for use either as dielectric layers or as encapsulants. Such materials are particularly useful as dielectric layers and encapsulants for hybrid integrated circuits (HICs) in which a silicon chip is mounted on a ceramic substrate having a metal conductive pattern on one surface.

A particularly good dielectric layer for use with high voltage HICs is a piolymethylphenylsiloxane containing about sixty-five percent by weight of a silica filler which will be described more completely later. This material resists applied high voltages without breakdown, has good adhesive qualities and therefore is useful as a dielectric layer between a high-voltage silicon chip and a ceramic substrate upon which metal conductors have been defined. Unfortunately, examination of this material by a scanning electron microscope (SEM) shows microcracks in the material after cure. Such cracks limit the long-term reliability of the material for use either as an electron device encapsulant or dielectric layer.

SUMMARY OF THE INVENTION

In accordance with the invention, a dielectric for use with an electronic device comprises a silicone precursor consisting essentially of (a) about eighteen to twenty-two percent by weight of a silicone resin consisting essentially of dimethylsiloxane, and/or dimethyl-methylphenylsiloxane, and/or dimethyldiphenylsiloxane, (b) about fifty-nine to seventy-one percent by weight of a silica filler, (c) about eleven to fifteen percent by weight of a solvent of the resin, (d) 0.4 to 0.6 percent by weight of a tin compound catalyst, and (e) about 0.05 to 0.2 percent by weight of copper (II) benzoylacetonate. The precursor is cured by heating at a temperature of between about 170° and 190° C. for about ten to twelve hours, which causes evaporation of the solvent and polymerizes the resin. After the cure, the material consists essentially of (a) about twenty-one to twenty-five percent by weight of a silicone resin consisting essentially of dimethylsiloxane, and/or dimethyl-methylphenylsiloxane, and/or dimethyl-diphenylsiloxane, and/or dimethyl-diphenylsiloxane, (b) about seventy to eighty percent by weight of a silica filler, (c) about 0.5 to 0.7 percent by weight of a tin catalyst, and (d) about 0.57 to 0.26 percent by weight of copper (II) benzoylacetonate.

The resins that are used are hydroxy terminated; that is, the resin is composed of organic molecules, each terminated at opposite ends by a hydroxy (OH) radical. The tin catalyst that is used is tin octanate, although other tin compounds could probably be alternatively used. The improved silicone material can be used either as a dielectric layer or as an encapsulation for a semiconductor device. Screen printing or other methods of depositing the material prior to cure may be used as is known the art.

I have found that the addition of the copper (II) benzoylactonate dissolved in a small amount of solvent such as xylene is effective in eliminating or reducing the incidence of microcracks in the material after cure. As such, the improved silicone material has greater reliability, both as an insulative material and as an encapsulant for protecting an electronic device from harmful elements of the surrounding environment.

These and other objects, features and benefits of the invention will be better understood from a consideration of the following detailed description taken in conjunction with the accompanying drawing.

DETAILED DESCRIPTION

Figure 1:
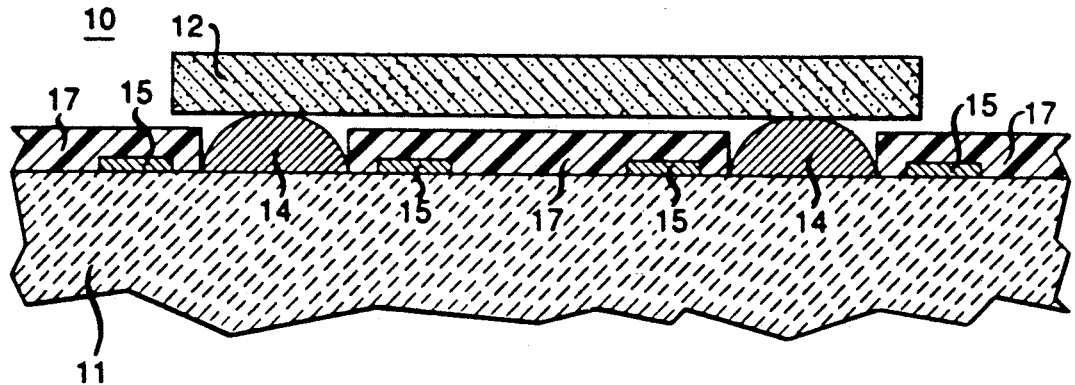
FIG. 1 is a schematic sectional view of a portion of a hybrid integrated circuit implying an improved silicone material made in accordance with an illustrative embodiment of the invention.

Referring now to FIG. 1, there is shown schematically a hybrid integrated circuit 10 comprising a ceramic substrate 11 upon which is mounted a silicon chip 12. It is to be understood that the Figure is not to scale, and in fact is distorted with respect to actual dimensions for the purpose of illustrating the structure and function of relevant components. The chip 12 has defined within it a number of high-voltage electronic devices such as, for example, devices known in the art as gated diode crosspoint switches, which may typically develop voltages in excess of 600 volts. The silicon chip is mounted on the ceramic substrate by solder members 14, which may be solder leads and/or elements referred in the art as "solder bumps." An electronic circuit is defined on the upper surface of the ceramic substrate by a plurality of metal conductors 15, which may typically be of gold, or have an outer coating of gold. The conductors 15 are insulated and encapsulated by a dielectric layer 17 of a silicone resin polymer which is preferably deposited by the known screen printing process.

A silicone resin of the prior art that has been investigated for use as the dielectric layer 17 has been a hydroxy terminated polymethyl-phenylsiloxane commercially available from the DuPont Company of Wilmington, Del., known as Blue-Sil. Microscopic examination of the cured silicone polymer showed microcracks in the material. It is clear that such a tendency is undesirable since the material must have constant electrical insulation characteristics over time if it is to be used as a dielectric layer, and must reliably protect the device from outside contaminants if it is to be used as an encapsulant. In accordance with the invention, I have reformulated the silicone composition so as to contain copper (II) benzoylacetonate (CBA) dissolved in a small amount of a volatile carrier such as xylene. This additive is primarily responsible for solving the problem of microcracking in the resin.

The silicone resin is initially applied as a polymer precursor, which through cure is polymerized to the final dielectric layer 17. Table I sets forth the ranges of values of constituent materials of the silicone polymer precursor and the silicone polymer resin after cure.

TABLE I

| Component | Weight Percentages | |
|---|---|---|
| | Before Cure | After Cure |
| resin | 18-22% | 21-25% |
| silica filler | 59-71% | 70-80% |
| tin catalyst | .4-.6% | .3-.7% |
| CBA | .05-2% | .057-0.26% |
| solvent | 11-15% | ~0 |

The silicone resin that is used consists essentially of dimethylsiloxane and/or dimethyl-methylphenylsiloxane and/or dimethyldiphenylsiloxane; that is, the resin consists of any of the three solvents mentioned or any mixture of any of the three. The molecules of such resins are hydroxy terminated and may have the form shown below.

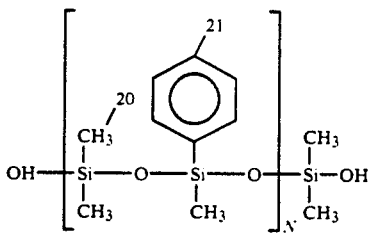

The molecule portion designated with the reference numeral 20 is a dimethyl portion, while molecule portion designated with the reference numeral 21 is a phenyl-methyl portion. The molecule may also include diphenyl portions, and one can see that opposite ends of the molecule are terminated by OH or hydroxy radicals. The silica filler preferably comprises about 1.5 to three percent fumed silica, with the remainder consisting essentially of fused silica. The resin is cured by heating it at a temperature of between about 170° and 190° C. for a period of time of between about ten and twelve hours. A tin catalyst that preferably consists essentially of tin octanate aids in the curing. The temperature conditions are not so extreme as to harm the gated diode devices within the silicon chip 12. The curing volatilizes the resin solvent, which may illustratively be α-terpineol, which has the effect of changing the relative percentages of the various components after cure as shown in Table I. The CBA, as mentioned before, is copper II benzoylacetonate dissolved in a small amount of xylene solvent, although other solvents could be used. Since curing polymerizes the resin precursor, it is to be understood that terms such as "dimethylsiloxane" are synonymous with terms such as "polydimethylsiloxane" which may be applied to the fully cured material.

With the silicone resin made as described above, it was found that the microcracking problem is virtually eliminated. That is, scanning electron microscope (SEM) photographs of the upper surfaces and of various sections of the cured resin showed no microcracking, whereas the conventional Blue-Sil deposited and cured in the normal manner did show such microcracking.

Figure 2:
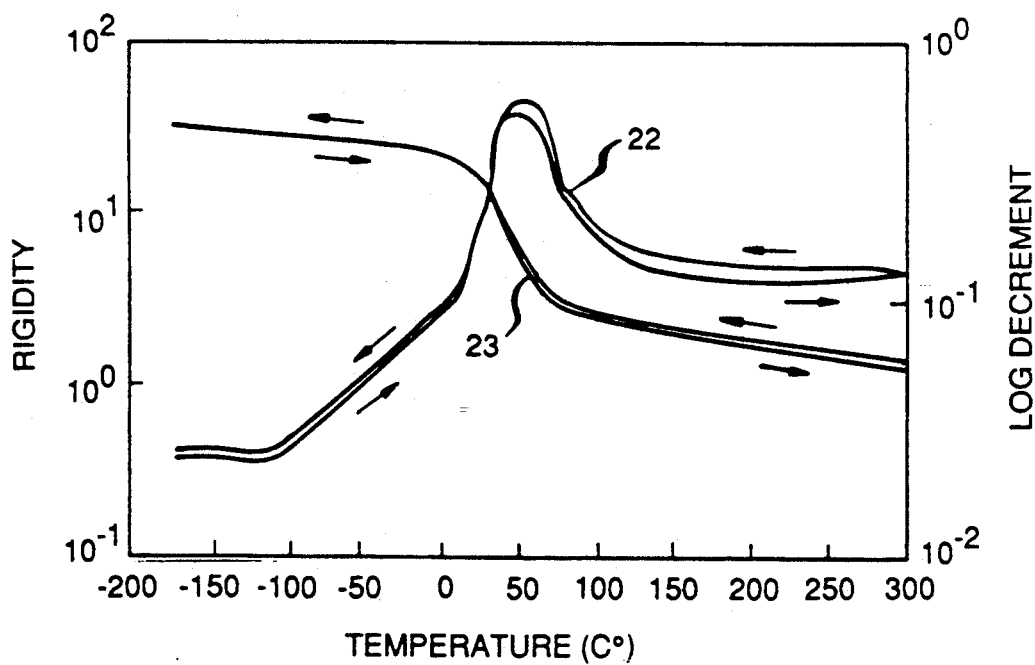
FIG. 2 is a graph of rigidity versus temperature for the silicone materials that may be used in the device in FIG. 1.

The relative absence of microcracking is further demonstrated by the graph of FIG. 2 in which curves 22 and 23 show changes of rigidity as a function of temperature of two samples made in accordance with the invention. The arrows show the direction of temperature change. Referring, for example, to curve 22, arrows directed to the left show a decrease of temperature. The arrows to the right near curve 22 show an increase in temperature and show that the rigidity as a function of temperature is substantially the same when the temperature is increased as it is when the temperature is decreased. The sample characterized by curve 23 shows a different relationship of rigidity with respect to temperature, but again the change of rigidity with respect to a decrease of temperature is substantially the same as the change of rigidity with respect to an increase of temperature.

Figure 3:
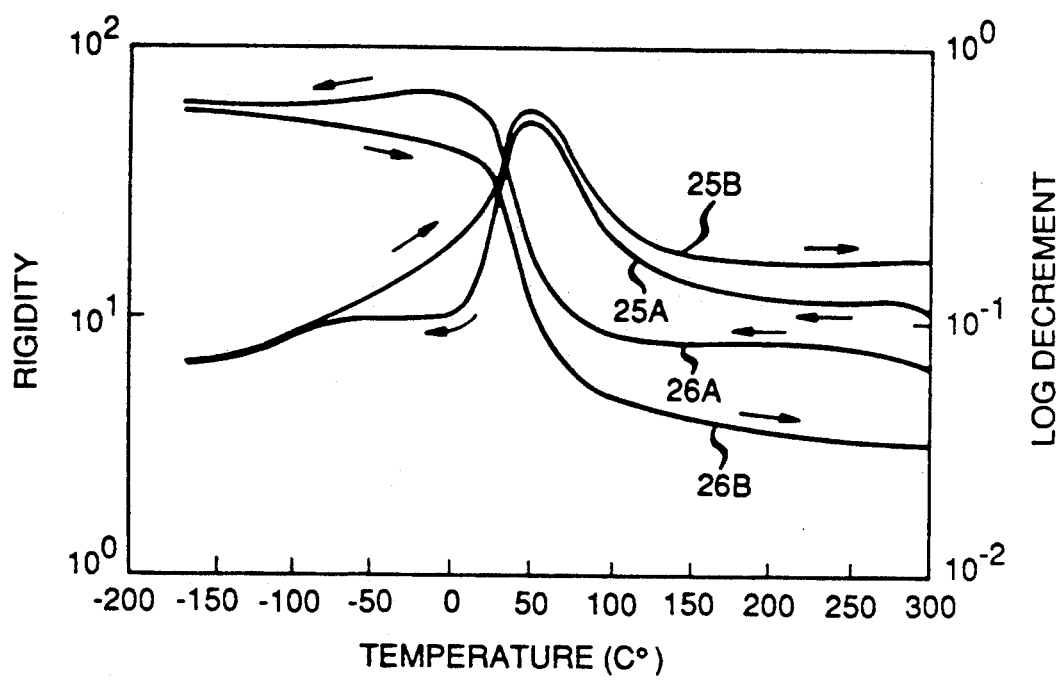
FIG. 3 is a graph of rigidity versus temperature for silicone materials of the prior art that are not made in accordance with the present invention.

FIG. 3 shows temperature dependence curves 25 and 26 for two samples of Blue-Sil silicone of the prior art. The curves demonstrate differences of rigidity with increasing temperature as opposed to decreasing temperature for each sample. Curve 25A shows the rigidity change with decreasing temperature of one sample, while curve 25B shows the rigidity change of the same sample with increasing temperature. One can see that curve 25A follows a different path from 25B, which indicates that there has been a change in the structure of the material as a consequence of the temperature cycling. This asymmetrical reaction to temperature cycling is analogous to hysteresis and is symptomatic of microcracking within the silicone resin during the change of temperature. Another sample shown by curves 26A and 26B demonstrates a similar hysteresis effect. My invention eliminates or significantly reduces the hysteresis effect as a consequence of the elimination or reduction of microcracking.

The various embodiments shown and described are merely illustrative of the invention concept. For example, the improved silicone resin may be used only as a dielectric layer, only as an encapsulate, or both, as has been described. Various other embodiments and modifications can be made by those skilled in the art without departing from the spirit and scope of the invention.

I claim:

1. An article of manufacture comprising an electronic device having on at least one surface thereof a cured dielectric material for insulating the electronic device comprising a silicone resin characterized in that:
    the dielectric material consists essentially of (a) about twenty-one to twenty-five percent by weight of a silicone resin selected from the group consisting of dimethylsiloxane, dimethyl-methylphenylsiloxane, dimethyl-diphenylsiloxane, and mixtures thereof, (b) about seventy to eighty percent by weight of a silica filler, (c) about 0.5 to 0.7 percent by weight of a tin catalyst, and (d) about 0.57 to 0.26 percent by weight of copper (II) benzoylacetonate.

2. The article of claim 1 further characterized in that:
    the resin is composed of organic molecules each terminated at opposite ends by a hydroxyl radical.

3. The article of claim 2 further characterized in that:
    the tin catalyst consists essentially of tin octanate.

4. The article of claim 3 further characterized in that:
    the dielectric is cured at a temperature of between about 170° and 190° C. for a time period equal to about ten and twelve hours.

5. The article of claim 1 further characterized in that:
    the dielectric material constitutes a dielectric layer for insulating the electronic device from a ceramic substrate, the ceramic substrate including conductors on one surface thereof.

6. The article of claim 1 further characterized in that: the dielectric material constitutes an encapsulation for the electronic device.

7. The article of claim 1 further characterized in that: the dielectric material constitutes an encapsulation for an electronic device and a dielectric material for insulating the electronic device from a ceramic substrate, the ceramic substrate including conductors on one surface thereof.

8. The article of claim 3 further characterized in that: the filler comprises about 1.5 percent to three percent of fumed silica, with the remainder consisting essentially of fused silica.

9. A process for making an electronic device comprising the steps of: forming conductors on a surface of a substrate; making a silicone resin precursor; depositing the precursor over the conductors; and curing the precursor by heating it at a temperature of between about 170° and 190° C. for about ten to twelve hours, characterized in that:
the precursor consists essentially of (a) about eighteen to twenty-two percent by weight of a silicon resin selected from group consisting essentially of dimethylsiloxane, dimethyl-methylsiloxane, dimethyl-diphenylsiloxane, and mixtures thereof (b) about fifty-nine to seventy-one percent by weight of a silica filler, (c) about eleven to fifteen percent by weight of a solvent of the resin, (d) 0.4 to 0.6 percent by weight of a tin compound catalyst, and (e) about 0.05 to 0.26 percent by weight of copper (II) benzoylacetonate.

10. The method of claim 9 further characterized in that:
the depositing step comprises the step of screen printing the precursor.

11. The method of claim 9 further characterized in that:
the depositing step comprises the step of encapsulating an electronic device component.

12. The method of claim 9 further characterized in that:
the tin compound consists essentially of tin octanate.

13. The method of claim 9 further characterized in that:
the solvent consists essentially of α-terpineol.

* * * * *

UNITED STATES PATENT AND TRADEMARK OFFICE
CERTIFICATE OF CORRECTION

PATENT NO. : 5,085,913
DATED : February 4, 1992
INVENTOR(S) : C. P. Wong

It is certified that error appears in the above—identified patent and that said Letters Patent is hereby corrected as shown below:

Title Page, Other Publications, line 3 "Katon" should read --Raton--.
Column 1, line 10 after the quotation marks delete "An"; Column 1, line 26 "piolymethylphenylsiloxane" should read --polymethylphenylsiloxane--;
Column 1, line 60 after "diphenylsiloxane," delete "and/or dimethyl-diphenylsiloxane,"; Column 1, line 63 "0.57" should read --.057--;
Column 2, line 6 after "known" insert --in--; Column 2, lines 7-8 "benzoylactonate" should read --benzoylacetonate--. Column 3, line 20 "solvents" should read --siloxanes--; Column 4, line 39 "encapsulate" should read --encapsulant--; Column 4, line 59 "hydroxyl" should read --hydroxy--; Column 4, line 64 after "to" insert --between--.
Column 6, line 1 after "from" insert --the--, after "consisting" delete "essentially"; Column 6, line 2 "dimethyl-methylsiloxane" should read --dimethyl-methylphenylsiloxane--.
Column 1, line 10 after "paper" insert a comma.

Signed and Sealed this

Third Day of August, 1993

Attest:

MICHAEL K. KIRK

*Attesting Officer*    *Acting Commissioner of Patents and Trademarks*